United States Patent [19]

Schulz

[11] Patent Number: 5,639,970
[45] Date of Patent: Jun. 17, 1997

[54] CURRENT SELECTION CIRCUITRY FOR MAGNETIC FLOWMETER

[75] Inventor: Robert K. Schulz, Plymouth, Minn.

[73] Assignee: Rosemount Inc., Eden Prairie, Minn.

[21] Appl. No.: 503,306

[22] Filed: Jul. 17, 1995

[51] Int. Cl.$^6$ .................................................. G01F 1/58
[52] U.S. Cl. ........................ 73/861.12; 73/861.16; 363/17
[58] Field of Search ................. 73/861.12, 861.16, 73/861.17; 363/17, 98

[56] References Cited

U.S. PATENT DOCUMENTS

| | | | |
|---|---|---|---|
| 4,193,298 | 3/1980 | Kayama et al. | 73/861.16 |
| 4,229,703 | 10/1980 | Bustin | 328/162 |
| 5,372,045 | 12/1994 | Schulz | 73/861.12 |

OTHER PUBLICATIONS

Integrated Circuits Unitrode, "Low-Power BiCMOS Current-Mode PWM", pp. 5–319—5–322.

*Primary Examiner*—Richard Chilcot
*Assistant Examiner*—Harshad Patel
*Attorney, Agent, or Firm*—Westman, Champlin & Kelly, P.A.

[57] ABSTRACT

A magnetic flowmeter system provides a volumetric flow rate output and includes flowmeter electronics for coupling to a flowtube assembly. The flowtube assembly includes a coil which receives a magnetic field producing coil current from a supply circuit in the flowmeter electronics. The coil produces a magnetic field which generates an EMF in the field representative of flow. An EMF sensor senses the generated EMF and provides an output indicating flow. The supply circuitry is coupled to coil wires of the coil and is responsive to a control signal. A sensor senses the frequency response of the coil and generates a sensor output. A comparator compares the sensor output with a predetermined level and provides a comparator output based upon the comparison. Control circuitry provides the magnitude control signal to the current based upon the comparison.

17 Claims, 4 Drawing Sheets

CURRENT SELECTION CIRCUITRY FOR MAGNETIC FLOWMETER

BACKGROUND OF THE INVENTION

The present invention relates generally to magnetic flowmeters. More specifically, the present invention relates to a magnetic flowmeter which automatically selects the current level for use with different flowtubes.

A magnetic flowmeter measures the volumetric flow rate of a conductive fluid by detecting the velocity of the fluid passing through a magnetic field. Magnetic flowmeter systems typically include a flowtube assembly and a transmitter assembly. The flowtube assembly is installed in a process piping line, either vertically or horizontally, and includes a pipe section, a coil section and electrodes. The coils are located on opposite sides of a cross section of the pipe. The coils, energized by a coil drive current from the transmitter, develop a magnetic field along the cross section of the pipe. Two electrodes are located across the pipe from each other along a line which is perpendicular to the magnetic field. Fluid passing through the pipe is electrically conductive. As a result of the conductor movement through the magnetic field, an electric potential or electromotive force (EMF) is induced in the fluid which is detected by the electrodes. Operation is thus based on Faraday's law of electromagnetic induction.

Typically, electronic circuitry in the magnetic flowmeter is designed to be used with different types of flowtubes. It is also desirable to interchange different types of flowtubes with the same flowmeter circuitry. The coils in the flowtube are designed for different drive currents. This information is specified by the manufacturer. A larger drive current provides a signal of greater magnitude. However, improperly large drive currents can heat the coil, causing damage. Further, improperly large currents do not allow the induced magnetic field to settle, leading to improper measurement. Thus, the flowmeter circuitry must be configured by an operator to provide the proper drive current to the flowtube. Configuring of the electronic circuitry is time consuming and introduces an additional step that must be performed during flowmeter installation or reconfiguration. Additionally, the step of configuration can be a source of operator error. An error in selecting the drive current could damage the flowtube resulting in needless expense or could be a source of errors in flow measurements.

SUMMARY OF THE INVENTION

The present invention is a magnetic flowmeter for measuring flow of a fluid. A flowtube assembly receives the flow and includes a coil. The coil receives a current which produces a magnetic field thereby generating an EMF in the field representative of flow in the flowtube. An EMF sensor senses the EMF and generates an output indicating fluid flow. A power supply supplies power current to the coil and is responsive to a supply control signal. The frequency response of the flowtube is measured and the supply control signal is responsively adjusted.

DETAILED DESCRIPTION OF THE PREFERRED EMBODIMENTS

Figure 1:
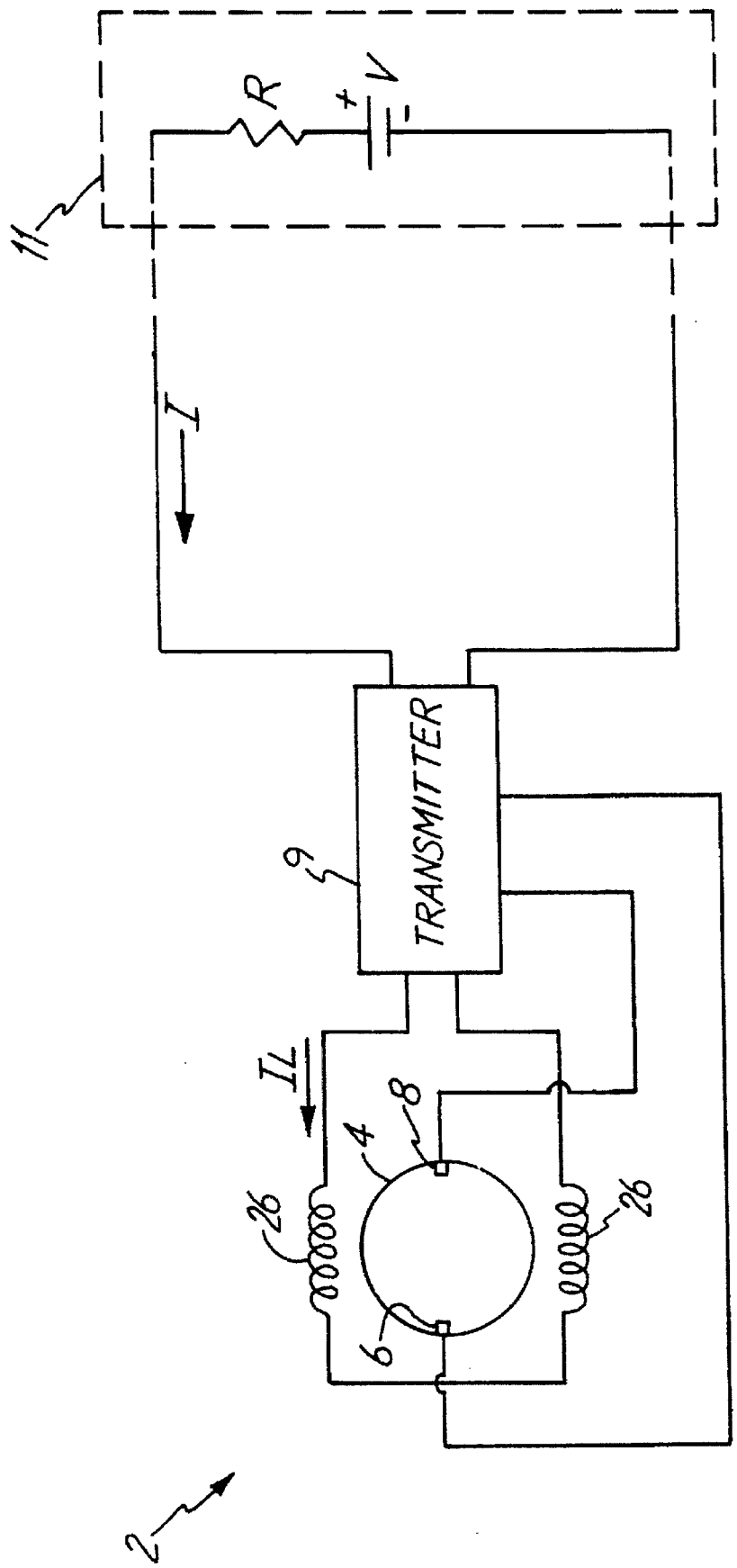
FIG. 1 is a block diagram of a magnetic flowmeter in a two-wire communication loop.

In FIG. 1, magnetic flowmeter system 2 connects to two-wire communication 4–20 mA loop carrying current I and an AC power line (not shown). Flowtube 4 carries a fluid flow. Transmitter 9 supplies coil drive current $I_L$ to coils 26 adjacent flowtube 4 which generate a magnetic field in the fluid. Electrodes 6,8 mount in flowtube 4 along a line perpendicular to the magnetic field in the fluid for sensing EMF induced by the fluid flow. Transmitter 9 senses the EMF between electrodes 6,8 and controls a DC output current I representative of the sensed EMF which is, in turn, proportional to fluid flow. Transmitter 9 transmits current I over a 4–20 mA current loop to a remote receiving station 11. Transmitter 9 can also transmit the flow output digitally using HART digital protocol, for example.

As described herein, the present invention automatically selects the appropriate level for $I_L$ (75 mA, 125 mA or 500 mA) based upon the particular flowtube 4 connected to transmitter 9. This determination is made by monitoring the response of coil 26 to a relatively high frequency excitation. It has been determined that a flowtube with a faster signal response may be driven with a greater drive current $I_L$ than a flowtube with a slower response.

Figure 2:
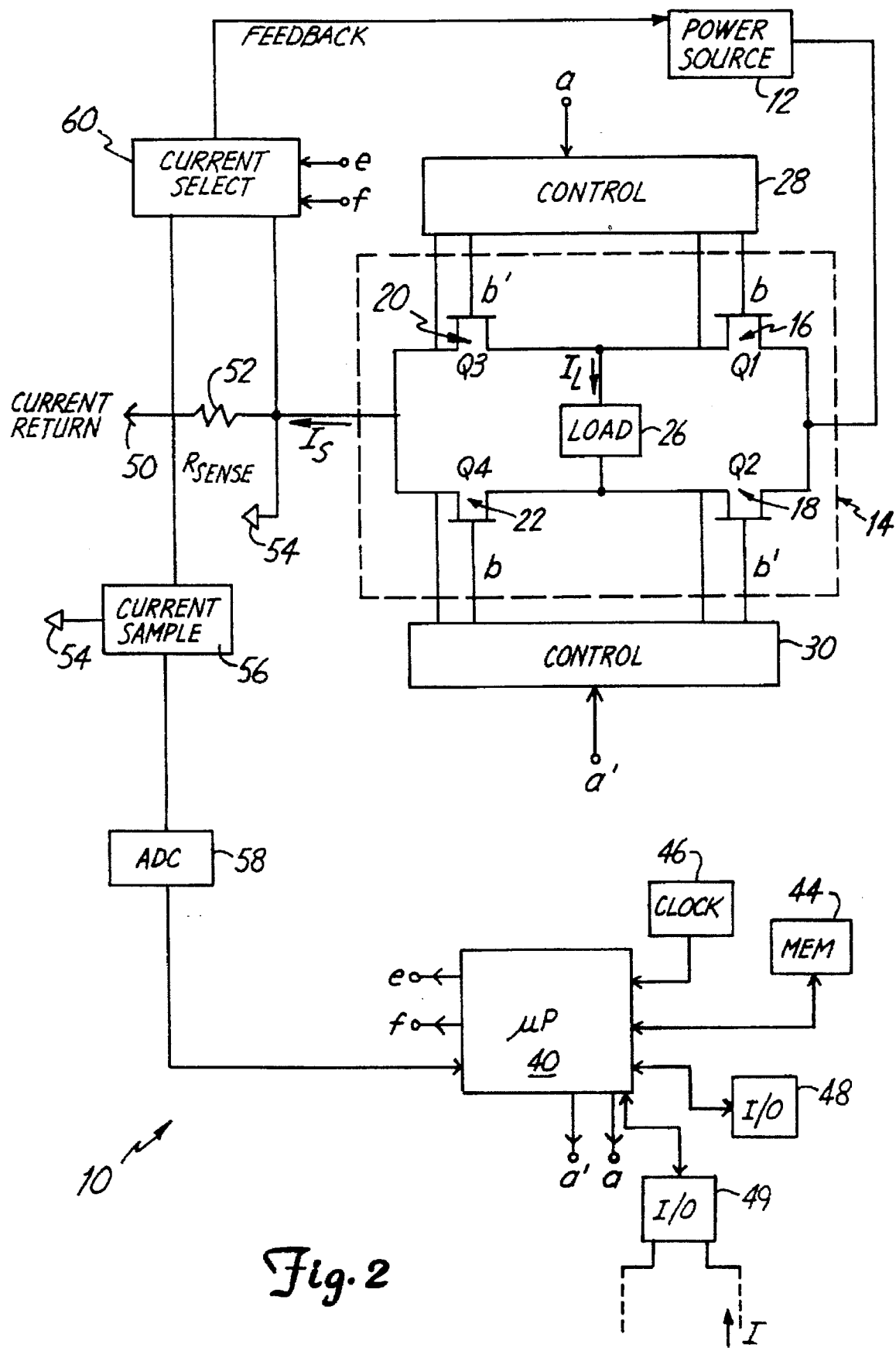
FIG. 2 is a schematic diagram showing a bridge pulse controlled current driver for a magnetic flowmeter.

FIG. 2 shows driver circuitry 10 in transmitter 9. H-bridge flow tube driver 10 of magnetic flowmeter system 2 generates alternating drive current $I_L$ to a load (coils) 26. In H-bridge driver 10, power source 12 energizes a transistor bridge circuit 14. In bridge circuit 14, control circuits 28 and 30 connect to the gates of field effect transistor (FET) 16, FET 18, FET 20 and FET 22 to switch them on in pairs to provide alternating current to load 26. Lines from power source 12 connect to drain terminals of FETs 16 and 18, and to source terminals of FETs 20 and 22. The source terminal of FET 16 and the drain terminal of FET 20 connect to one side of the load 26. Control circuits 28 and 30 convert input HIGH and LOW logic levels to desired voltage bias levels compatible to the gates of transistors 16, 18, 20, 22 for switching between ON and OFF states.

Microprocessor 40 produces control outputs a and a' at the desired operating frequency, typically 37.5 Hz as a function of the sensed current. Outputs a and a' provide logic levels to circuits 28 and 30, respectively. Microprocessor 40 is connected to memory 44, clock 46, operator input/output (I/O) circuitry 48 and loop I/O circuitry 49. Memory 44 contains programming instructions to control operation of microprocessor 40. Microprocessor 40 operates at a speed determined by clock 46 and receives operator command inputs through input/output circuitry 48. Input/output circuitry 49 is used to provide an output connection over the 4–20 mA current loop.

In one embodiment, supply 12 is a switching power supply. As described below, bridge circuit 14 periodically alternates, or commutates power source 12 through load 26.

During a first alternation or condition period, signal a goes HIGH and a' goes LOW. Control circuits drive signal b HIGH and b' LOW causing transistors 16 and 22 to conduct and transistors 18 and 20 to turn off, thereby supplying current $I_L$ in the direction shown by the arrow. Similarly, during a second alternation or conduction period, signal a goes LOW and a' goes HIGH. Control circuits 28 and 30 drive signal b to LOW and b' to HIGH causing transistors 18 and 20 to turn on and 16 and 22 to turn off thereby supplying current $I_L$ in a direction opposite that shown by the arrow. During normal operation, this alternation is at 37.5 Hz and, in some cases, 6 Hz.

Current $I_S$ from power source 12 flows to return path 50 through a sense resistor $R_{SENSE}$ 52. Resistor 52 also connects to signal ground 54. Current sample circuitry 56 connects to sense resistor 52 and provides an output representative of the frequency response of load 26 to analog-to-digital converter 58 which is connected to microprocessor 40.

The output of current sample circuitry 56 is representative of the magnitude of current $I_S$ flowing through sense resistor 52 and the frequency response of load 26. Microprocessor 40 monitors the magnitude of $I_S$ using analog-to-digital converter 58. During normal operation, microprocessor 40 controls transistors 16 through 22 such that current flowing through load 26 is pulsed at a rate of 6 Hz or 37.5 Hz, as selected by the user. During current selection, microprocessor 40 increases the frequency of the current flowing through load 26 to 83.4 Hz. As described in more detail below, microprocessor 40 monitors current $I_S$ through current sample circuitry 56 and ADC 58 to determine the appropriate output for power source 12. Voltage feedback provided by current select circuitry 60 to power source 12 is adjusted by microprocessor 40 by controlling inputs e and f.

Figure 3:
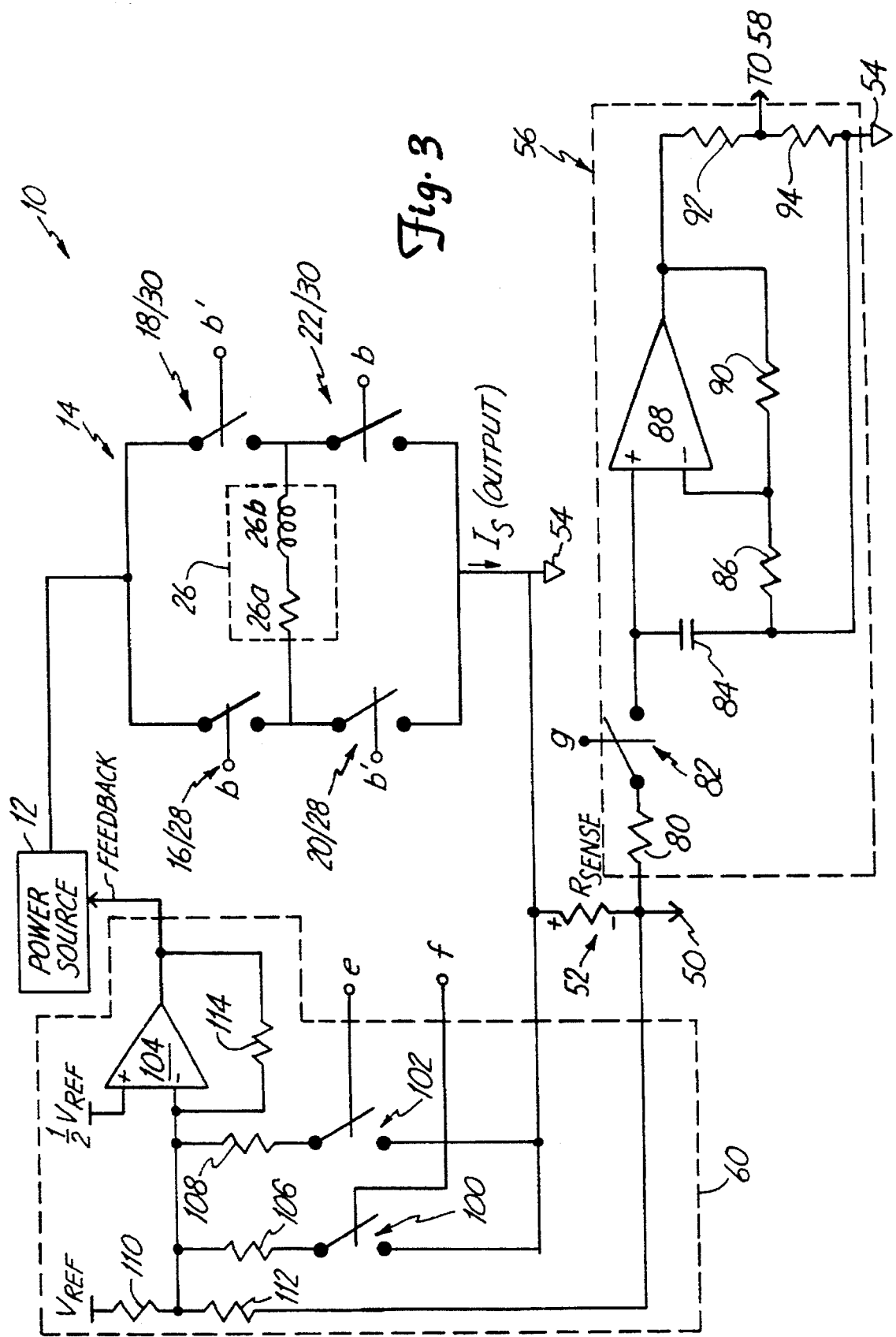
FIG. 3 is a schematic diagram showing current selection circuitry of FIG. 2.

FIG. 3 is a more detailed schematic diagram showing current sample circuitry 56 and current select circuitry 60. Coil 26 is shown as coil resistance 26a and inductor 26b. Current sample circuitry 56 includes resistor 80 connected to sense resistor 52. Resistor 80 is selectively coupled by switch 82 to filter capacitor 84 which connects to electrical ground 54. Capacitor 84 is also connected to resistor 86 which connects to the inverting input of operational amplifier 88. The non-inverting input of operational amplifier 88 connects to sense resistor 52 through resistor 80 and switch 82. Operational amplifier 88 is connected with negative feedback through resistor 90, and the output of operational amplifier 88 is provided to a voltage divider formed by resistors 92 and 94. The input to analog-to-digital converter 58 (shown in FIG. 2) is connected between resistors 92 and 94. In one embodiment, resistor 80 is 50KΩ and capacitor 84 is 1 µF. Resistors 86 and 90 are 5KΩ and 20KΩ, respectively, such that operational amplifier 88 provides a gain of five. Resistors 92 and 94 should be selected such that the input to analog-to-digital converter 58 does not exceed its maximum input voltage threshold. Sampling switch 82 has a control input g which may be connected directly to microprocessor 40 or derived from clock 46.

Figure 4:
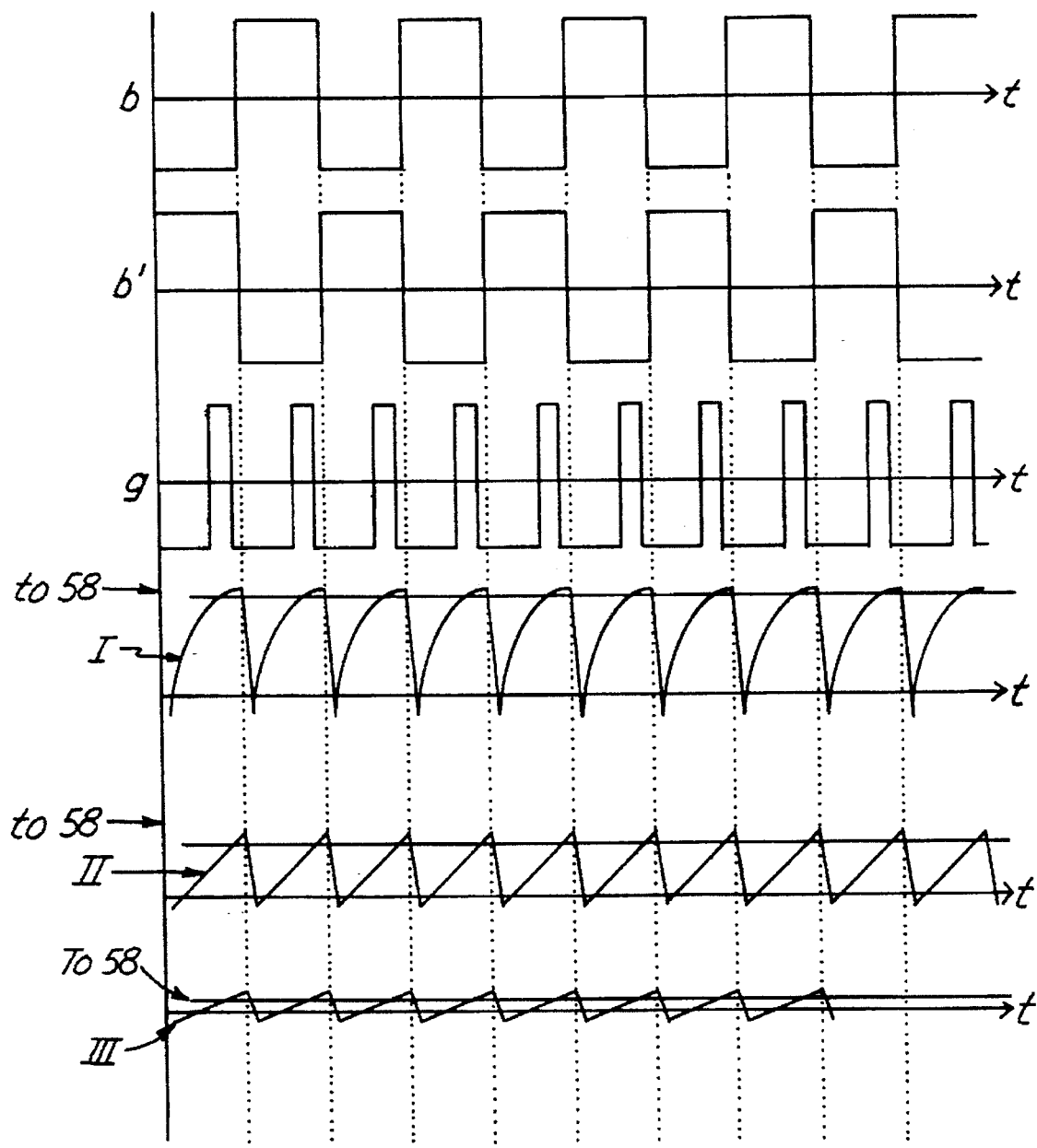
FIG. 4 shows timing diagrams illustrative of relationships between timing signals produced by the circuitry of the magnetic flowmeter of FIGS. 1 through 3.

FIG. 4 is a signal diagram which shows signals during operation of the circuitry of FIG. 3. Inputs b and b' to control circuits 28, and 30, respectively, are shown as square waves in FIG. 4. During current selection, these signals have a frequency of 83.4 Hz and are 180° out of phase as shown in FIG. 4. Input g to sampling switch 82 is shown in FIG. 4 and is a short pulse which occurs near the end of each half cycle of signals b and b'.

Signals I, II and III show the voltage output from sense resistor 52 for three different industry standard flowtubes 4. The shape of waveforms I, II and III are dependent upon the resistance 26a and inductance 26b combinations in flowtube 4. The L/R (26a,26b) combination of load 26 acts as a filter and changes the frequency response of load 26. Loads with a fast response can be driven at higher currents. In one embodiment a sampled I through resistor 52 of less than about 0.2 amps results in a drive current of about 75 mA, a sampled I about 0.2 to about 0.43 amps results a drive current about 125 ma, a sampled I of more than about 0.43 amps results in a current of about 500 mA.

As shown in FIG. 4, sampling switch 82 is actuated by signal g near the peak in signals I, II and III. This sampled voltage level is provided to capacitor 84 which acts as a holding capacitor to the high impedance input of operational amplifier 88. Operational amplifier 88 is connected to provide a gain of five and the output is divided by the combination of resistors 92 and 94. FIG. 4 also shows the output provided to analog-to-digital converter 58 from current sample circuitry 56 for each of the three waveforms I, II and III. The output of current sample circuitry 56 is representative of the peak value of current $I_S$ flowing through sense resistor 52.

Based upon the voltage provided by current sample circuity 56 to analog-to-digital converter 58, microprocessor 40 controls the current $I_L$ flowing through load 26 by controlling the feedback provided to power source 12 through current select circuitry 60 shown in FIG. 3. In the embodiment shown, the frequency of $I_L$ is constant during normal operation. Current select circuitry 60 includes switch 100 connected to resistor 52 at the output of bridge circuit 14. Switch 100 has control input f. Switch 100 selectively couples a feedback signal from the output of bridge 14 to an inverting input of operational amplifier 104 through resistor 106. Switch 102 includes a control input e and is connected in a similar manner to the inverting input of operational amplifier 104 through resistor 108. A resistor 110 is connected to a voltage reference $V_{REF}$ to sense resistor 52 through resistor 112. Resistors 110 and 112 act as a voltage divider and their midpoint is connected to the inverting input of operational amplifier 104. Negative feedback is provided from the output of operational amplifier 104 through a feedback resistor 114 connected to the inverting input of operational amplifier 104. The non-inverting input of operational amplifier 104 is connected to a voltage which is less than $V_{REF}$, for example $V_{REF}/2$. The output of operational amplifier 104 is provided to power source 12 and provides a voltage feedback to power source 12. In one preferred embodiment, power source 12 is a switching power supply based upon a low power BiCMOS current-mode PWM chip UCC2803 available from Unitrode of Merrimack, N.H.

Microprocessor 40 controls the feedback provided by current select circuitry 60 by controlling inputs e and f in response to the voltage output of current sample circuitry 56. Microprocessor 40 compares the output of circuitry 56 with threshold levels stored in memory 44 and selects an appropriate drive current level based upon the comparison.

In one preferred embodiment, resistor 106 is 84.5KΩ, resistor 108 is 104KΩ, resistor 110 is 23.7KΩ, resistor 112 is 7KΩ and feedback resistance 114 is 124KΩ. Microprocessor 40 selectively controls the voltage fed back to power source 12 to select between 75 mA, 125 mA and 500 mA output from power source 12 to flowtube 4. With switches 100 and 102 open, 500 mA are provided by power source 12. With switch 100 open and switch 102 closed, power supply 12 provides 125 mA. Finally, with switch 102 open and switch 100 closed, power supply 12 provides 75 mA. Switches 100, 102 and 82 may be of an appropriate design such as BJTs, FETs or CMOS switches.

In one embodiment, an operator provides an input to microprocessor 40 through I/O circuitry 48 which indicates that resistance 26a of flowtube 26 is greater than 25 Ohms. If this condition is true, microprocessor 40 will not drive flowtube 26 at 500 mA to avoid excess power dissipation in flowtube 26.

Although the present invention has been described with reference to preferred embodiments, workers skilled in the art will recognize that changes may be made in form and detail without departing from the spirit and scope of the invention. For example, more than three drive current levels may be employed and the comparison, current selection and control may be through any appropriate analog or digital technique.

What is claimed is:

1. A magnetic flowmeter for measuring a fluid flow, comprising:

a flowtube assembly receiving the flow having a coil with first and second coil wires for receiving a coil current producing a magnetic field generating an EMF in the field representative of flow;

EMF sensing means for sensing the EMF and generating an output indicating flow;

a power supply coupled to the coil wires providing the coil current to the coil in response to a feedback signal;

a sensor generating an output related to frequency response of the coil and the coil current and responsively providing a sensor output; and control circuitry for providing the feedback signal to the power supply based upon the sensor output.

2. The magnetic flowmeter of claim 1 wherein the sensor includes a sense resistor connected in series with the coil to receive the coil current therethrough.

3. The magnetic flowmeter of claim 1 wherein the sensor includes:

a sampling means for sampling a voltage related to the coil current; and a holding capacitor connected to the sampling means for holding a sampled voltage representative of magnitude of the coil current.

4. The magnetic flowmeter of claim 1 wherein the control circuitry includes:

an analog-to-digital converter for converting the sensor output into a digital value; and a microprocessor for receiving the digital value and comparing the digital value to a predetermined value related to frequency responses of known flowtubes.

5. The magnetic flowmeter of claim 1 wherein the power supply comprises a switching power supply.

6. The magnetic flowmeter of claim 5 wherein the control circuitry comprises voltage feedback generating circuitry for providing the feedback signal which comprises a feedback voltage to the switching power supply.

7. The magnetic flowmeter of claim 6 wherein the voltage feedback circuitry comprises a resistor.

8. The magnetic flowmeter of claim 1 wherein the coil current is selectable between 75 mA, 125 mA and 500 mA based upon the feedback signal provided to the power supply.

9. The magnetic flowmeter of claim 1 including a plurality of electrical switches selectively coupling the coil current to the coil at a normal operating frequency during flow measurement and at an autoselection frequency when the control circuit monitors the sensor output, wherein the autoselection frequency is higher than the normal operating frequency.

10. A method for selecting drive current for a flowtube in a magnetic flowmeter, comprising the steps of:

driving the flowtube with an alternating signal;

sensing current flowing through the flowtube;

determining frequency response of the flowtube to the alternating signal based upon the sensed current; and setting the drive current for the flowtube based upon the frequency response.

11. The method of claim 10 wherein determining frequency response comprises determining magnitude of the sensed current.

12. The method of claim 10 wherein driving the flowtube comprises driving the flowtube with an alternating current having a frequency which is greater than a normal operating frequency.

13. The method of claim 10 wherein setting the current drive current comprises setting the drive level to a plurality of discrete values.

14. The method of claim 13 wherein the plurality of discrete values comprises 75 mA, 125 mA and 500 mA.

15. The method of claim 10 wherein setting the drive current comprises adjusting feedback to a power supply.

16. The method of claim 10 wherein determining frequency response comprises sampling peak values in the sensed current.

17. The method of claim 10 wherein setting the drive current includes comparing the frequency response of the flowtube to frequency responses of known flowtubes.

* * * * *